United States Patent [19]

Shiotari

[11] Patent Number: 4,467,520

[45] Date of Patent: Aug. 28, 1984

[54] METHOD OF MANUFACTURING MASK TYPE READ ONLY MEMORY

[75] Inventor: Yoshihisa Shiotari, Yokohama, Japan

[73] Assignee: Tokyo Shibaura Denki Kabushiki Kaisha, Kawasaki, Japan

[21] Appl. No.: 408,873

[22] Filed: Aug. 17, 1982

[30] Foreign Application Priority Data

Aug. 17, 1981 [JP] Japan .................. 56-128450

[51] Int. Cl.$^3$ .................. H01L 21/265; H01L 21/22
[52] U.S. Cl. .................. 29/576 B; 29/571;
29/578; 148/1.5; 148/187; 357/23; 357/91
[58] Field of Search ............ 29/576 B, 571, 578;
148/1.5, 187; 357/91, 23 VT

[56] References Cited

U.S. PATENT DOCUMENTS

| | | | |
|---|---|---|---|
| 4,108,686 | 8/1978 | Jacobus, Jr. .................. | 148/1.5 |
| 4,336,647 | 6/1982 | McElroy .................. | 29/576 B |
| 4,356,042 | 10/1982 | Gedaly et al. .................. | 148/1.5 |
| 4,364,165 | 12/1982 | Dickman et al. .................. | 29/571 |
| 4,364,167 | 12/1982 | Donley .................. | 29/576 B |
| 4,365,405 | 12/1982 | Dickman et al. .................. | 29/576 B |
| 4,380,866 | 4/1983 | Countryman, Jr. et al. ........ | 148/1.5 |
| 4,384,399 | 5/1983 | Kuo .................. | 29/571 |
| 4,406,049 | 9/1983 | Tam et al. .................. | 29/571 |

Primary Examiner—Upendra Roy
Attorney, Agent, or Firm—Oblon, Fisher, Spivak, McClelland & Maier

[57] ABSTRACT

A method of manufacturing a mask type read only memory having an interconnection wiring and a plurality of MOS transistors, wherein selected source and drain regions are shortened in accordance with a user program after the interconnection wiring layer is formed on the semiconductor substrate. After that, a protective film is formed over the entire surface of the read only memory.

3 Claims, 20 Drawing Figures

METHOD OF MANUFACTURING MASK TYPE READ ONLY MEMORY

BACKGROUND OF THE INVENTION

1. Field of the Invention

This invention relates to a method of manufacturing a mask type Read Only Memory (ROM) and more particularly to a writing method in which the time for writing data into the ROM is short.

2. Description of the Prior Art

Figure 1:
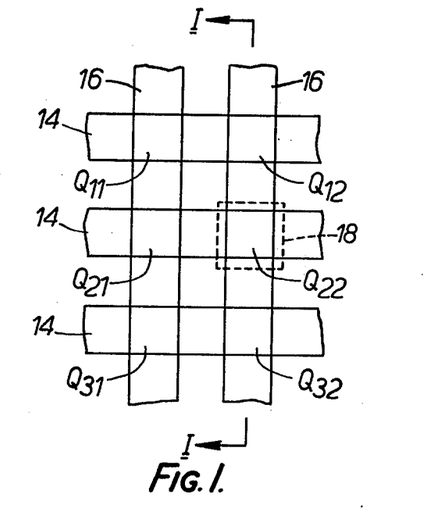
FIG. 1 is a plan view of a known semiconductor device.
Figure 2:
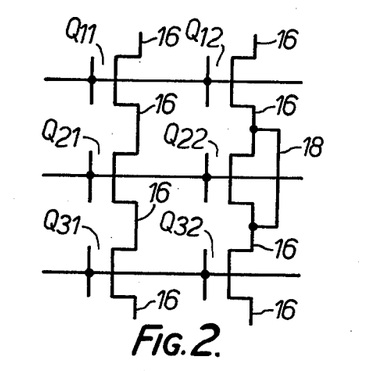
FIG. 2 is an equivalent circuit of the semiconductor device shown in FIG. 1.
Figure 3:
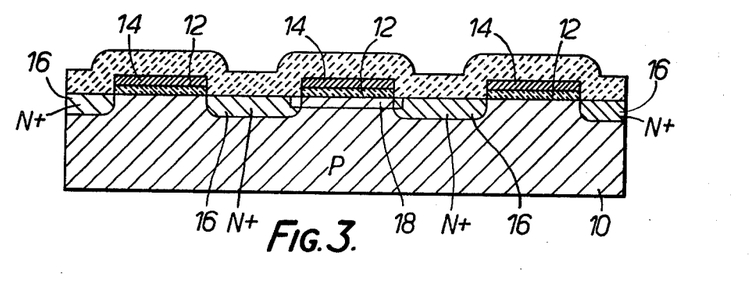
FIG. 3 is a cross-sectional view taken along line I—I in FIG. 1.

A prior art mask type Read Only Memory is shown in FIGS. 1 to 3. A gate insulating film 12 and a gate electrode 14 are formed on a P type semiconductor substrate 10. An N+ region 16 is formed between gate electrodes 14 by a diffusion process. In the Read Only MEMORY shown in FIGS. 1 and 2, MOS transistors $Q_{11}$, $Q_{21}$ and $Q_{31}$ and MOS transistors $Q_{12}$, $Q_{22}$ and $Q_{32}$ are connected in series, respectively. (Load transistors are not shown.)

The number of gates provided in the semiconductor devices depend on user specification. For example, in order to render the MOS transistor $Q_{22}$ nonoperative, the source and drain of the MOS transistor $Q_{22}$ are shorted by means of an ion implanted layer 18. However, the ion implantation process as mentioned is performed at a initial stage of the wafer fabrication process, and this leads to a delay in the appointed date of delivery.

Proposals to cope with this problem are disclosed in U.S. Pat. No. 4,080,718, wherein an impurity is introduced into the channel region by ion implantation in a final fabrication stage, in order to render the MOS transistor into a depletion type.

In the final step, a PSG layer is etched and the impurity is then introduced into the semiconductor substrate by the ion-implantation process. The semiconductor device fabricated is delivered with the implanted regions exposed. As a result, its reliability is poor.

SUMMARY OF THE INVENTION

An object of the invention is to provide an improved mask type Read Only Memory and a method for manufacturing the same by which it is possible to deliver the semiconductor products more quickly than with prior processes.

This and other objects are achieved according to this invention by providing a novel method of manufacturing a mask type Read Only Memory including the steps of (a) forming a first insulating layer having a thick portion and a thin portion for a field region and a gate insulating layer, (b) forming a polysilicon layer on the insulating layer, (c) forming gate electrodes of first and second MOS transistors by partially removing the polysilicon layer, (d) forming a second conductivity type region to be the source and drain regions of the MOS transistors in the semiconductors substrate, (e) forming a second insulating film on the semiconductor substrate in which the MOS transistors are formed, (f) forming a contact hole in the second insulating film on the second conductivity type region of the second MOS transistor for allowing the formation of an outer electrode, (g) forming the outer electrodes and bonding pads, (h) connecting the source and drain regions of the first MOS transistor in accordance with a set program by ion implantation of a second impurity type, (i) forming a protective film on the bonding pads, the outer electrodes, and the MOS transistors, and (j) removing the protecting film on the bonding pad.

BRIEF DESCRIPTION OF THE DRAWINGS

A more complete appreciation of the invention and many of the attendant advantages thereof will be readily obtained as the same becomes better understood by reference to the following description when considered in connection with the accompanying drawings, wherein.

DESCRIPTION OF THE PREFERRED EMBODIMENTS

Figure 4:
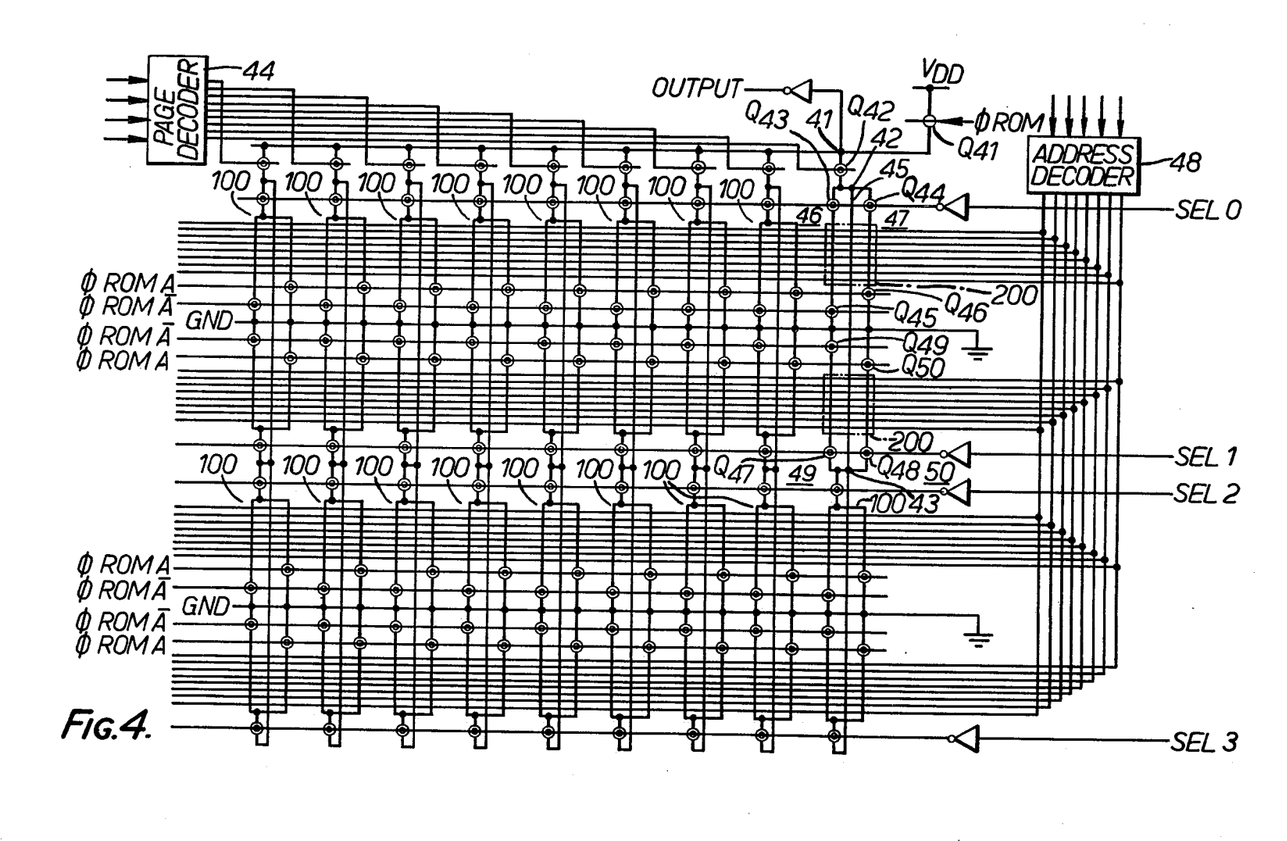
FIG. 4 is a circuit of the mask type Read Only Memory of the present invention.

Referring now to the drawing, wherein like reference numerals designate identical or corresponding parts throughout the several views, and more particularly to FIGS. 4, 5A, 5B, 5C, and 5D thereof, in FIG. 4, the mask type Read Only Memory consists of a plurality of NAND gate blocks 100 arranged in a row and column matrix, wherein one of the blocks is selected by outputs of a page decoder 44 and select signals $Sel_0$–$Sel_3$. The NAND gate blocks 100 consist of four NAND gate circuits 46, 47, 49, 50, and one of which is selected by transistors $Q_{45}.Q_{46}.Q_{49}.Q_{50}$ to which signals $\Phi ROM.$-$\Phi ROM.\overline{A}$ are applied. Predetermined data are selectively written into matrix cell portion 200.

The mask type Read Only Memory according to this invention has a first power source terminal $V_{DD}$, a second power source terminal GND, an output terminal 41, a first branch node 42 and a second branch node 43. A precharge IGFET $Q_{41}$ of P channel type is connected between the first power source terminal $V_{DD}$ and the output terminal 41. An N channel type IGFET $Q_{42}$ is connected between the output terminal 41 and the first branch node 42. Aluminum wiring electrode 45 is interconnected between the first branch node 42 and the second branch node 43. A first NAND circuit 46 and a second NAND circuit 47 are formed between the first branch node 42 and the second power source terminal GND. N channel type IGFET $Q_{43}.Q_{44}$ in the first and second NAND circuits 46,47 select both of the first and second NAND circuits 46,47 simultaneously. N channel type IGFET $Q_{45}.Q_{46}$ in the first and second NAND circuits 46,47 select one of NAND circuits 46 and 47. Matrix cell portions are connected to address decoder 48.

A third NAND circuit 49 and a fourth NAND circuit 50 are provided in addition to first and second NAND circuits 46,47.

Figure 5A:
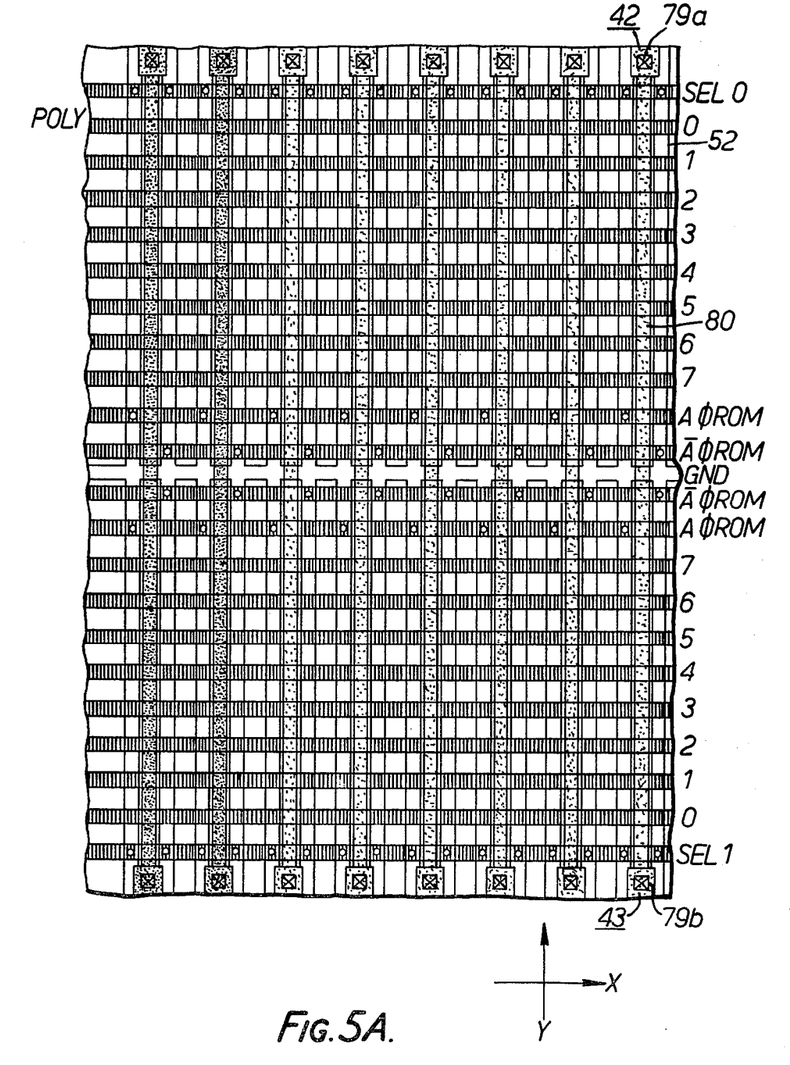
FIG. 5 is plan view illustrating a pattern layout of the mask type Read Only Memory according to the present invention.
Figures 5B, 5C, 5D:
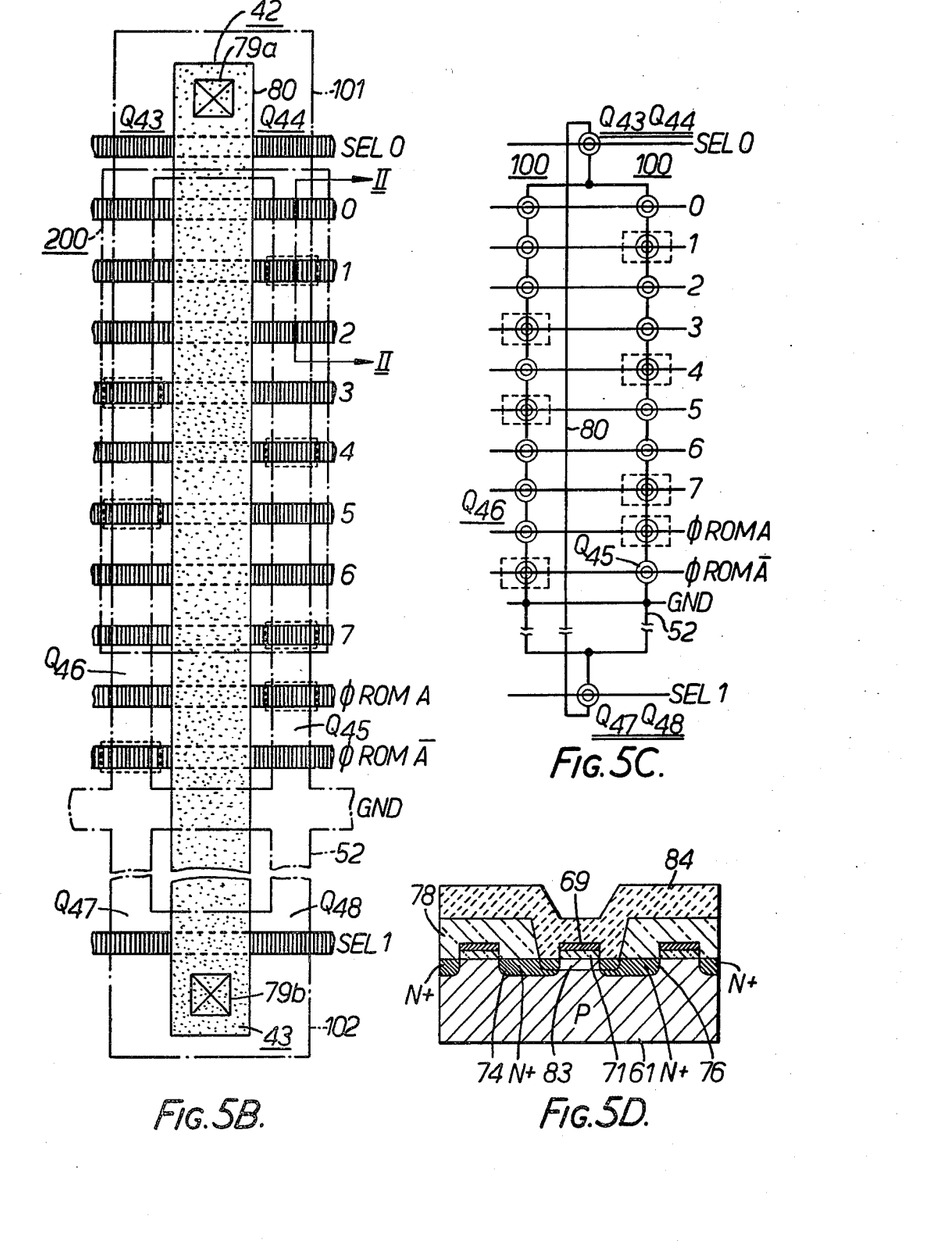
FIG. 5B is plan view illustrating a pattern layout of the mask type Read Only Memory cell according to the present invention.
FIG. 5C is an equivalent circuit of the mask type Read Only memory cell shown in FIG. 5B.
FIG. 5D is a cross-sectional view taken along line II—II in FIG. 5B.

FIG. 5A illustrates a pattern layout of the mask type Read Only memory corresponding to the circuit of FIG. 4. FIG. 5B illustrates a pattern layout of a portion of the pattern layout of FIG. 5A. FIG. 5C is an equivalent circuit of the mask type Read Only memory cell shown in FIG. 5B. FIG. 5D is a cross-sectional view taken along line II—II in FIG. 5B.

In FIGS. 5A to 5D, a polysilicon gate electrode layer 69 is formed on an insulating layer 71 interposed between a P type substrate 61 and the gate electrode layer 69. N+ diffused regions 74,76 are provided between the channel region. The diffused regions 101,102 (or region 52 constituting regions 74,76) are formed in a "figure 8" shape as shown in FIG. 5B. Insulated aluminum wiring layer 80 is provided in the center of the "figure 8" shape diffused region, and the aluminum layer 80 connects diffused regions 101, 102 at the contact holes 79a, 79b. The source and drain regions 74,76 of selected MOS transistors are connected by implanted channel region 83.

An embodiment of a method of manufacturing a mask type Read Only Memory according to the present invention is nextly described referring to FIGS. 6A to 6L.

Figure 6A:
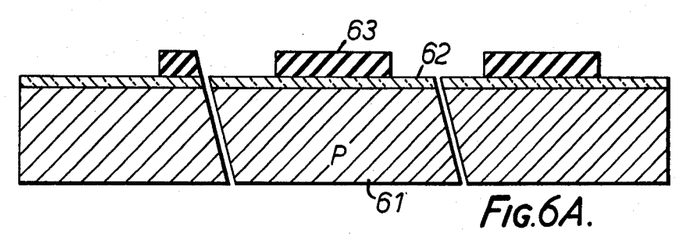
FIGS. 6A to 6L all cross-sectional views of a semiconductor substrate explaining a method of manufacturing a mask type Read Only Memory according to the present invention.
Figure 6B:
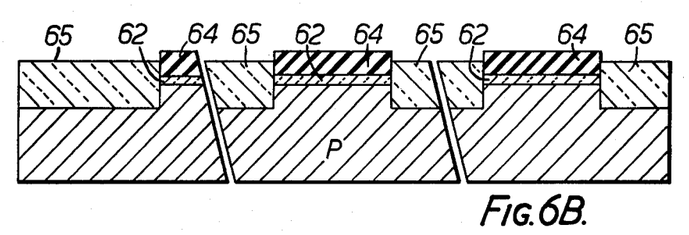

A thermal oxide film 62 of 1000 Å is formed over the entire surface of a P type silicon substrate 61 doped with boron by a thermal oxidation process. A silicon nitride layer 63 of 3000 Å is deposited over its entire surface by a CVD process. The silicon nitride layer 63 is removed above active regions of the substrate 61 in which elements are to be formed by a photoengraving process (FIG. 6A). A wet oxidation process is performed in order to form an SiO$_2$ field oxide film 65 of 1 μm (FIG. 6B).

Figure 6C:
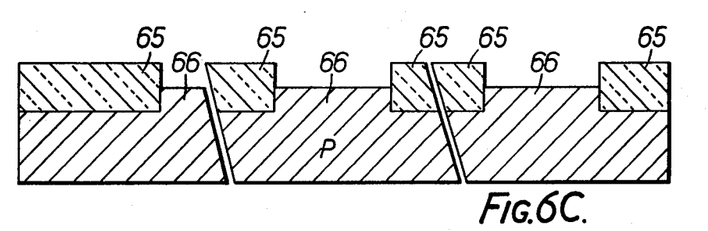
Figure 6D:
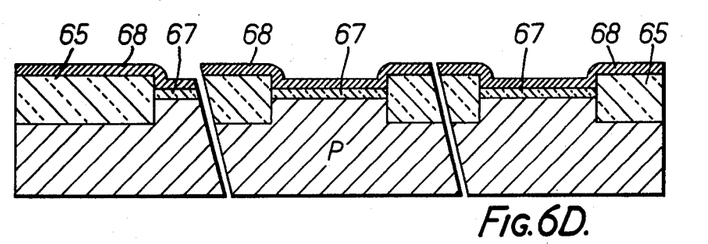
Figure 6E:
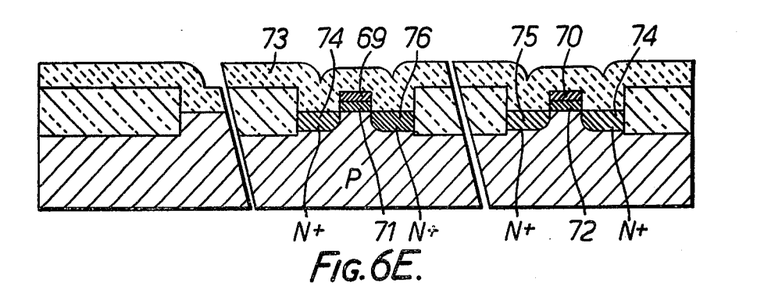
Figure 6F:
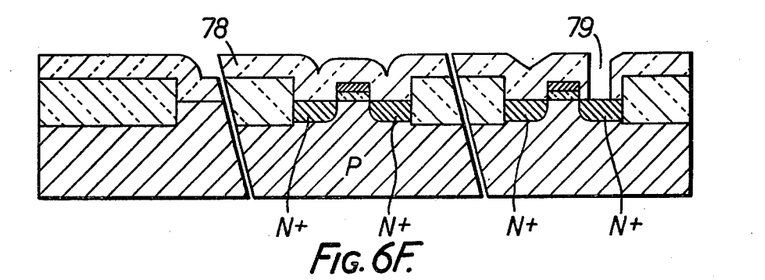
Figure 6G:
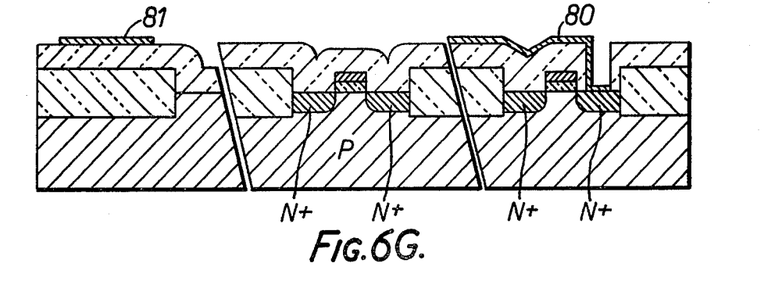
Figure 6H:
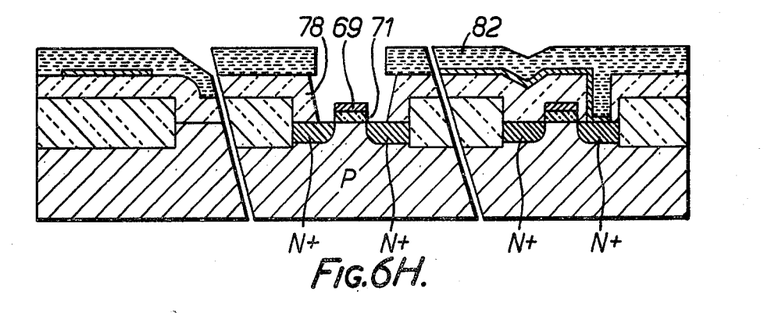
Figure 6I:
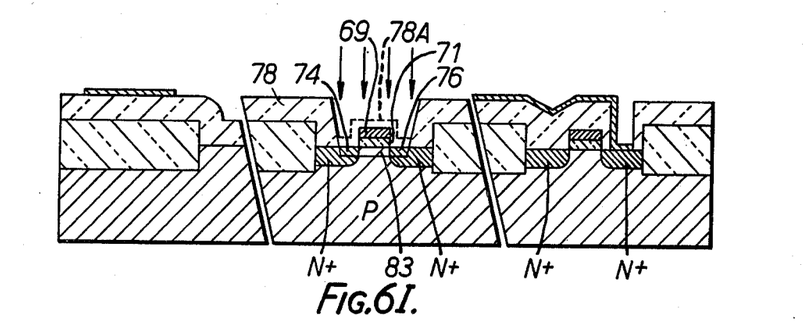

As shown in FIG. 6C, the silicon nitride mask 64 and the thermal oxide film 62 are removed by an engraving process whereby the surface of the semiconductor substrate 61 is exposed. A first thin insulating film (SiO$_2$) 67 of 500 to 1000 Å serving as a gate oxide film is formed on the exposed surface 66 of the semiconductor substrate 61. Nextly a polysilicon layer 68 of 3000~4000 Å is deposited over its entire surface by a CVD process (FIG. 6D). The polysilicon layer 68 is subjected to a photoengraving process to form a given pattern and thus gate electrodes 69,70 are formed. With a mask of the gate electrodes 69,70, the SiO$_2$ 67 is etched away to form gate oxide film 71,72. Nextly, a PSG film 73 is deposited over the entire surface by a CVD process. In the next step, by using the gate oxide films 71,72 as a mask, phosphorus in the PSG film 73 is diffused into the substrate to form N+ type drain and source regions 74,75 (FIG. 6E). Then the PSG film 73 is removed by an etching process. As shown in FIG. 6F, an SiO$_2$ layer 78 of 2000 to 6000 Å is formed on the surface as a third insulating layer by a CVD process. Contact hole 79 for an aluminum wiring electrode 80 is formed in the SiO$_2$ film 78. Nextly, as shown in FIG. 6G, aluminum is vapor-deposited over the entire surface and is photo-etched to form a bonding pad 81 and wiring electrode 80 at a given location. Nextly, a resist 82 is formed on the entire surface, and the SiO$_2$ film 78 covering selected transistors, of those transistors which are to store the information and which should be of the depletion type, is etched away. By using the SiO$_2$ film 78 (or resist 82) as a mask, impurity divalent phosphorus ions P++ of N type with energy of 160 KEV are implanted into a channel region through gate electrodes 69 and gate oxide film 71 (and the SiO$_2$ 78A). The N type implanted region 83 for connecting the source and drain of the selected transistor is then formed, and the transistor is rendered into depletion types (FIG. 6I).

Figure 6J:
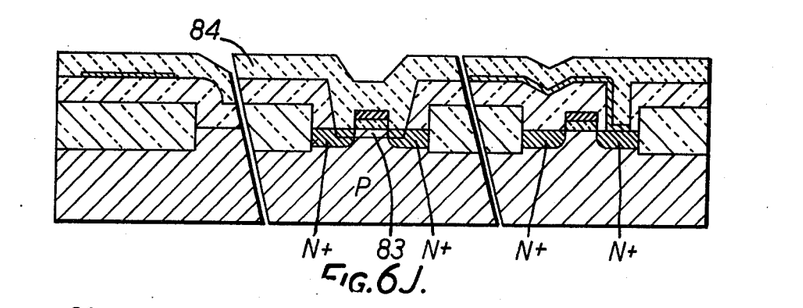
Figure 6K:
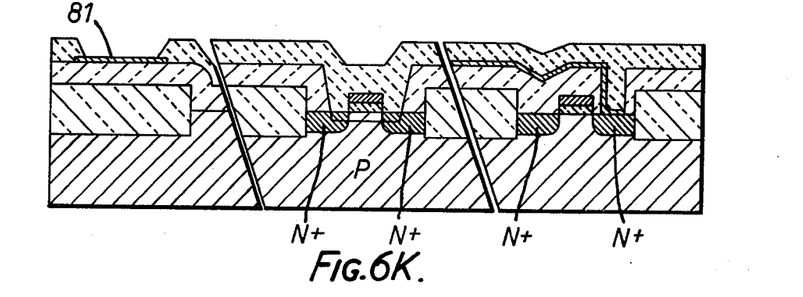
Figure 6L:
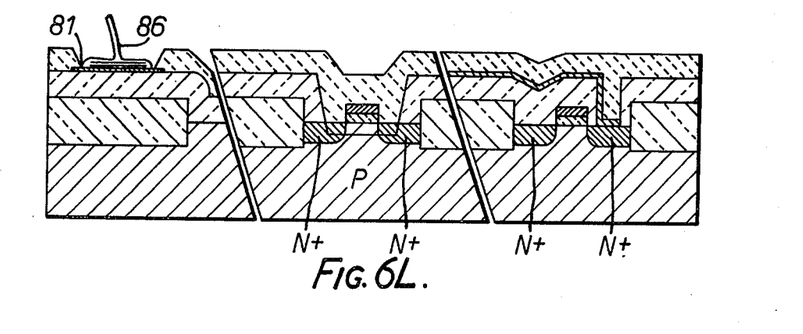

Nextly, as shown in FIG. 6J, a protective film 84 such as a BPSG (boron-doped phospho-silicate glass) film or a PSG film or a silicon nitride film of 5000 to 7000 Å by a plasma CVD method is deposited over the surface. As a result, the surface protective film 84 is also formed in a concave fashion. Accordingly, it is possible to check the stored information from its outer configuration. Nextly, as shown in FIG. 6K, a bonding pad 81 for connection to an outer-lead is formed, and the chip fabricating process is completed. As shown in FIG. 6L, an outer-lead 86 made from Au is connected to bonding pad 81.

In the mask type Read Only Memory of the present invention, the ion implantation into the channel region for forming a depletion type driver MOS transistor to determine the memory contents is performed at a later stage of the entire process. The fabricating process steps up to the SiO$_2$ film laying may be performed in advance before the memory contents are determined. Accordingly, after the memory contents are determined by customer request and a mask for the memory contents is obtained, the ion implantation into the above-mentioned channel region and the remaining steps are performed. According to this method of the present invention, the period from when the memory contents are specified by a customer until the products storing the contents are completed is considerably reduced. Because the protective film covering the depletion type transistor in the memory region is concave in shape the contents stored may be checked externally.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a mask type Read Only Memory, comprising the following steps in the following order:
   selectively forming a first insulating layer having a thick portion and a thin portion for a field region and a gate insulating layer, respectively, on a semiconductor substrate of a first conductivity type;
   forming a polysilicon layer on said insulating layer;
   forming gate electrodes of first and second MOS transistors by partially removing said polysilicon layer;
   forming second conductivity type regions to be source and drain regions of said MOS transistors in said semiconductor substrate;
   forming a second insulating film on said semiconductor substrate, in which the MOS transistors are formed by the source and drain regions and channel regions therebetween, said channel regions having said gate electrodes formed thereover;
   forming a contact hole in the second insulating film on the second conductivity type region of said second MOS transistor for allowing the formation of an outer electrode;

forming the outer electrodes in said contact hole and forming bonding pads on said second insulating film;

selectively removing said second insulating film and exposing the gate electrode and parts of source and drain regions of said first MOS transistor;

implanting ions of said second conductivity type to the channel region and said parts of source and drain regions of said first MOS transistor;

forming a protective film on said bonding pads, the outer electrodes, and the MOS transistors;

removing said protective film on the bonding pad; and providing an outer-lead in contact with the bonding pad.

2. The method according to claim 1, wherein said step of forming said thick portion of said first insulating region on a semiconductor substrate of the first conductivity type comprises the steps of:

forming a thermal oxide layer of the first conductivity type on the semiconductor substrate;

selectively forming a silicon nitride film on said thermal oxide layer;

forming a first thick insulating layer on the semiconductor substrate by oxidizing said semiconductor substrate using the silicon nitride film as a mask against the oxidizing; and removing said silicon nitride layer and the thermal oxide layer.

3. The method according to claim 1, wherein said step of forming a second conductivity type to be source and drain regions of said MOS transistors in said semiconductor substrate comprises the steps of:

forming first and second gate insulating films for said first and second MOS transistors by etching said first insulating film using said gate electrodes as an etching mask;

forming an impurity source film on said semiconductor substrate; and diffusing the impurities in the impurity source film into the semiconductor substrate so as to form source and drain regions.

* * * * *